United States Patent [19]
Song

[11] Patent Number: 5,959,893
[45] Date of Patent: Sep. 28, 1999

[54] METHOD OF ERASING A FLASH MEMORY DEVICE

[75] Inventor: Bok Nam Song, Ichon-Shi, Rep. of Korea

[73] Assignee: Hyundai Electronics Industries Co., Ltd., Kyungki-do, Rep. of Korea

[21] Appl. No.: 08/882,834

[22] Filed: Jun. 26, 1997

[30] Foreign Application Priority Data

Jun. 29, 1996 [KR] Rep. of Korea ................. 96-25553

[51] Int. Cl.⁶ ................................................. G11C 16/00
[52] U.S. Cl. .......................... 365/185.29; 365/185.18; 365/185.26
[58] Field of Search ................. 365/185.29, 185.33, 365/185.26, 185.18, 185.3

[56] References Cited

U.S. PATENT DOCUMENTS

| | | | |
|---|---|---|---|
| 5,255,237 | 10/1993 | Kodama | 365/185.29 |
| 5,295,107 | 3/1994 | Okazawa et al. | 365/185.18 |
| 5,299,166 | 3/1994 | Suh et al. | 365/185.3 |
| 5,327,385 | 7/1994 | Oyama | 365/218 |
| 5,357,476 | 10/1994 | Kuo et al. | 365/185.3 |
| 5,361,235 | 11/1994 | Kodama | 365/218 |
| 5,412,608 | 5/1995 | Oyama | 365/185.33 |
| 5,416,738 | 5/1995 | Shrivastava | 365/185.24 |

FOREIGN PATENT DOCUMENTS

| | | |
|---|---|---|
| 0621 603 A1 | 4/1993 | European Pat. Off. . |
| 0597 722 A2 | 11/1993 | European Pat. Off. . |
| 0762 428 A1 | 9/1996 | European Pat. Off. . |
| 94/27295 | 11/1994 | WIPO . |

*Primary Examiner*—Tan T. Nguyen
*Attorney, Agent, or Firm*—Scott C. Harris, Esq.

[57] ABSTRACT

The present invention discloses an erasure method which can minimize a flow of current from a drain region into a substrate due to a strong electric field formed between the drain region and the substrate when a flash memory device is erased. The first erasure operation is performed in condition that a voltage of −13V is applied to a control gate and a drain and source regions are grounded, and the second erasure operation is then performed in condition that a voltage of −13V is applied to the control gate, a voltage of 5V is applied to the drain region and the source region is floated.

2 Claims, 2 Drawing Sheets

METHOD OF ERASING A FLASH MEMORY DEVICE

BACKGROUND OF THE INVENTION

1. Field of the Invention

The present invention relates to a method of erasing a memory device, and more particularly to a method of erasing a memory device which can prohibit a current flow from a drain region to a silicon substrate by applying a low voltage and applying a normal erasure voltage sequentially to the drain region.

2. Description of the Prior Arts

Generally, in a flash memory, a tunneling phenomenon is used to erase a cell. That is, as shown in FIG. 1, a voltage of −13V is applied to a control gate 5, a voltage of 5V is applied to a drain region 3, and a source region 2 is floated. Therefore, the electrons stored at the floating gate 4 go out to the drain region 3, the memory cell is erased.

At this time, when voltage of 5V is applied to the drain region 3 and a voltage of −13V is applied to the control gate 5, holes generated at the drain region 3 go out to the substrate 1 due to its property of moving toward a lowest energy level and an electric field formed between the drain region 3 and the substrate 1. Therefore, a current flows excessively from the drain region 3 to the substrate 1 (hereinafter, called as "BTBT current: band to band tunneling current), the BTBT current prevents a smooth erasure of a device.

SUMMARY OF THE INVENTION

Accordingly, an object of the present invention is to provide a method of erasing a flash memory device which can reduce a BTBT current generated during erasure operation, thereby performing a smooth erasure operation of a device.

A method of erasing a flash memory device according to the present invention is accomplished by the first erasure operation performed during a given time T1 and the second erasure operation performed during a given time T2.

The first erasure operation is performed in condition that a voltage of −13V is applied to a control gate and a drain and source regions are grounded. The second erasure operation is performed in condition that a voltage of −13V is applied to the control gate, a voltage of 5V is applied to the drain region and the source region is floated.

BRIEF DESCRIPTION OF THE DRAWINGS

Other objects and advantages of the present invention will be understood by reading the detailed explanation of the embodiment with reference to the accompanying drawings in which.

DESCRIPTION OF THE INVENTION

The present invention will be described below in detail by reference to the accompanying drawings.

Figure 1:
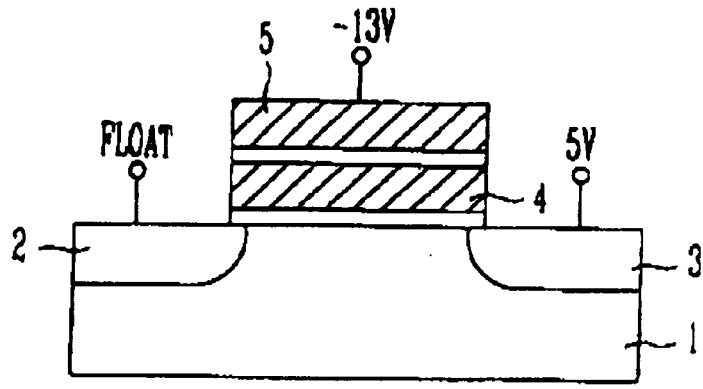
FIG. 1 is a cross-sectional view of a device showing conventional voltage condition for erasure of a flash memory device.
Figure 2A:
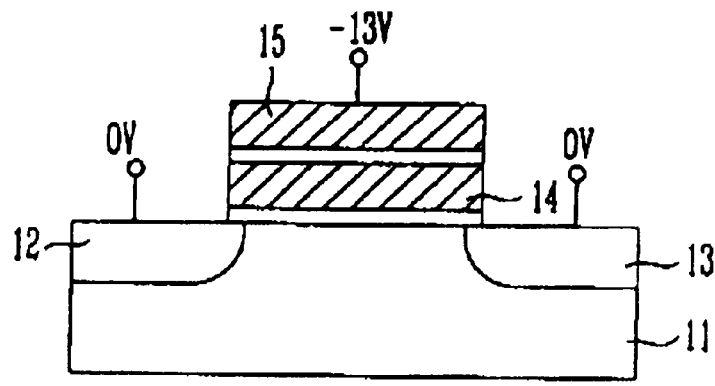
FIGS. 2A and 2B are cross-sectional views of a device showing voltage conditions for erasure of a flash memory device in accordance with the present invention.
Figure 2B:
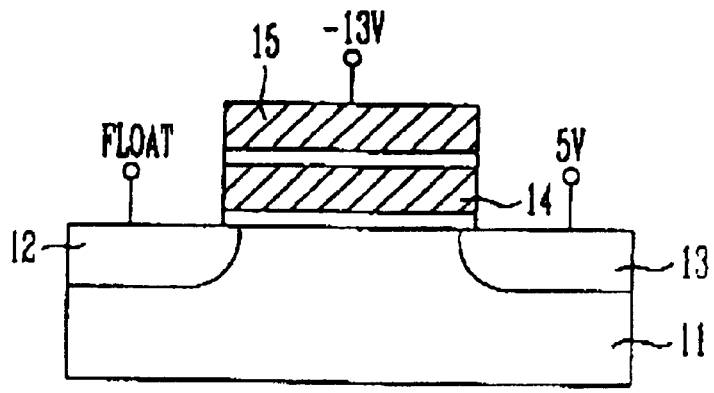
Figure 3:
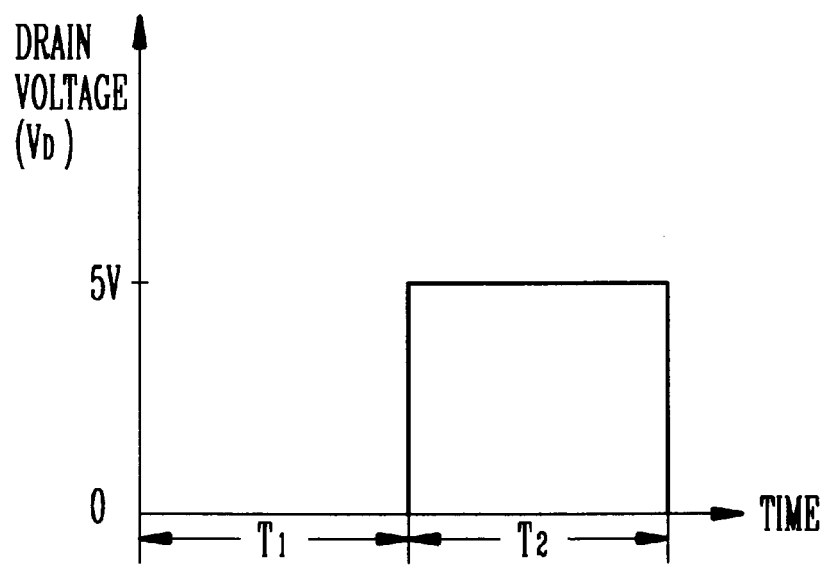
FIG. 3 is a graph for illustrating a change of voltage applied to a drain region in accordance with the present invention.

FIGS. 2A and 2B are cross-sectional views of a device showing voltage conditions for erasure of a flash memory device in accordance with the present invention, and FIG. 3 is a graph for illustrating a change of voltage applied to a drain region in accordance with the present invention.

In order to erase a flash memory device, as shown in FIG. 2A, a voltage of −13V is applied to a control gate 15, a voltage of 0 V is applied to the drain region 13 and a source region 12, respectively, during time T1, therefore, electrons stored at a floating gate 14 move toward the drain region 13 (the first erasure state).

However, as a potential difference between the drain region 13 and the floating gate 14 becomes relatively small by applying a voltage of 0V to the drain region 13, a relative weak electric field is formed between the drain region 13 and the substrate 11. As a result, as a electric field formed between the drain region 13 and the substrate 11 is weak, also, a potential difference between the drain region 13 and the substrate 11 can be ignored, the number of holes generated in the drain region 13 and then moved toward the substrate 11 is greatly reduced.

Thereinafter, as shown in FIGS. 2B and 3, a voltage 5V which is a normal erasure voltage is applied to the drain region 13, the source region 12 is floated and a voltage of −13V is applied to the control gate 15 during a time T2 (the second erasure state).

Figure 4:
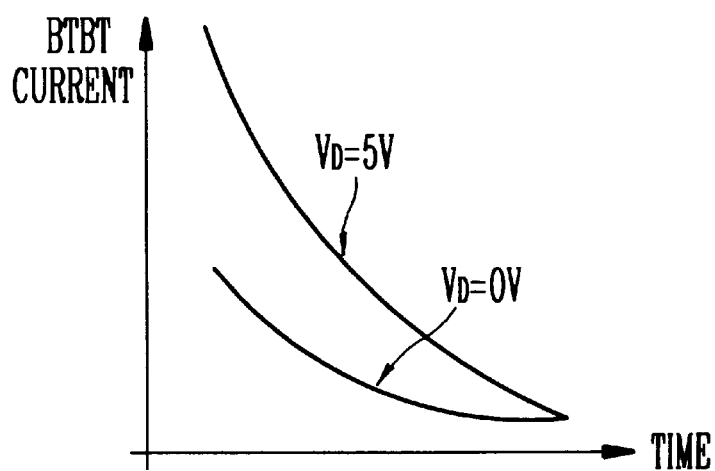
FIG. 4 is a graph for illustrating the amount of BTBT current in response to a drain voltage.

FIG. 4 is a graph for illustrating the amount of BTBT current in response to a voltage applied to the drain region. In FIG. 4, it can be seen that the lower a voltage is applied to the drain region, the less BTBT current flows.

As explained above, the first erasure operation is performed in condition that a voltage of −13V is applied to the control gate and a drain and source regions are grounded, and the second operation is then performed in condition that a voltage of −13V is applied to a control gate, a voltage of 5V is applied to a drain region and a source region is grounded, so that a flow of current from a drain region to a substrate can be minimized.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

We claim:

1. A method of erasing a flash memory device, comprising the steps of:

performing the first erasure operation in condition that a voltage of −13V is applied to a control gate a and a drain and source regions are grounded;

performing the second erasure operation in condition that a voltage of −13V is applied to the control gate and a voltage of 5V is applied to the drain region and the source region is floated.

2. A method of erasing a flash memory device, comprising the steps of performing a first erasure operation in a condition where a voltage of −13V is applied to a control gate and drain, and source regions are grounded, so that electrons stored at a floating gate move toward said drain region; and performing a second erasure operation in a condition that a voltage of −13V is applied to said control gate, a voltage of 5V is applied to said drain region and said source region is floated, wherein said first erasure operation is performed during a given time T1 and said second erasure operation is then performed during a given time T2 so that a flow of current from said drain region into a substrate due to a strong electric field formed between said drain region and said substrate is minimized.

* * * * *